United States Patent [19]
DeVoe et al.

[11] Patent Number: 5,367,430
[45] Date of Patent: Nov. 22, 1994

[54] MONOLITHIC MULTIPLE CAPACITOR

[75] Inventors: Alan D. DeVoe, Cambridge, Mass.;
Daniel F. DeVoe, Coronado, Calif.

[73] Assignee: Presidio Components, Inc., San Diego, Calif.

[21] Appl. No.: 964,150

[22] Filed: Oct. 21, 1992

[51] Int. Cl.⁵ .............................................. H01G 4/38
[52] U.S. Cl. ..................... 361/328; 361/303; 361/306.3; 361/321.3; 29/25.42
[58] Field of Search ............... 361/328, 329, 312, 313, 361/321, 330, 320, 306, 301.4, 303, 306.1, 306.2, 306.3, 308.1, 309, 272; 29/25.42

[56] References Cited

U.S. PATENT DOCUMENTS

| | | |
|---|---|---|
| 2,706,742 | 4/1955 | Ehlers . |
| 2,883,290 | 4/1959 | Planer et al. . |
| 2,997,635 | 8/1961 | Robinson . |
| 3,103,734 | 9/1963 | Donohue et al. . |
| 3,133,338 | 5/1964 | Fabricius et al. . |
| 3,184,660 | 5/1965 | Robinson . |
| 3,223,905 | 12/1965 | Fabricius . |
| 3,231,799 | 1/1966 | Geller et al. . |
| 3,237,066 | 2/1966 | Frantz . |
| 3,243,315 | 3/1966 | Markarian . |
| 3,243,671 | 3/1966 | Fabricius et al. . |
| 3,248,612 | 4/1966 | Rogers . |
| 3,255,395 | 6/1966 | Fabricius . |
| 3,255,396 | 6/1966 | Fabricius et al. . |
| 3,293,501 | 12/1966 | Martin . |
| 3,328,865 | 7/1967 | Sperry . |
| 3,426,249 | 2/1969 | Smyth . |
| 3,427,697 | 2/1969 | Tatem . |
| 3,496,433 | 2/1970 | Siegrist . |
| 3,496,434 | 2/1970 | Prokopowicz . |
| 3,585,535 | 6/1971 | Senf . |
| 3,588,631 | 6/1971 | Cooper et al. . |
| 3,588,640 | 6/1971 | Fabricius . |
| 3,619,220 | 11/1971 | Maher . |
| 3,638,083 | 1/1972 | Dornfeld . |
| 3,638,084 | 1/1972 | Burn . |
| 3,665,267 | 5/1972 | Acello . |
| 3,682,766 | 8/1972 | Maher . |
| 3,710,210 | 1/1973 | Heron . |
| 3,717,487 | 2/1973 | Hurley . |
| 3,740,624 | 6/1973 | McAdams . |
| 3,809,973 | 5/1974 | Hurley . |
| 3,811,937 | 5/1974 | Maher . |
| 3,890,546 | 6/1975 | Coleman . |
| 3,896,354 | 7/1975 | Coleman . |
| 3,902,102 | 8/1975 | Burn . |
| 3,920,781 | 11/1975 | Burn . |
| 3,987,347 | 10/1976 | Burn . |
| 3,988,498 | 10/1976 | Maher . |

(List continued on next page.)

FOREIGN PATENT DOCUMENTS

| | | | |
|---|---|---|---|
| 166916 | 3/1989 | Japan | 361/328 |
| 1185912 | 7/1989 | Japan | 361/328 |
| 1312816 | 12/1989 | Japan | 361/328 |

Primary Examiner—Geoffrey S. Evans
Assistant Examiner—Gregory Mills
Attorney, Agent, or Firm—McAndrews, Held & Malloy, Ltd.

[57] ABSTRACT

A monolithic multiple ceramic capacitor is made by interspersing layers of green tape containing ceramic powder in a binder with printed layers of electrical conductors, then compressing the layers and heating them to sinter the ceramic powder. Edge connections link the conducting layers in predetermined patterns to provide external connections to the capacitors. Use of parasitic or stray capacitance between pairs of external terminals provides additional useful values of capacitance. Unwanted stray capacitance between adjacent terminals is reduced by making slots by saw cuts or the like in either the green tape or the sintered material. Unwanted stray capacitance between elements inside the capacitor is reduced by ground planes between layers of capacitors and by layers of ceramic materials having relatively low dielectric constants to separate layers of capacitors, to form exterior layers of insulating material, or both.

29 Claims, 9 Drawing Sheets

U.S. PATENT DOCUMENTS

| | | |
|---|---|---|
| 4,027,209 | 5/1977 | Maher . |
| 4,038,587 | 7/1977 | Kaliebe . |
| 4,060,649 | 11/1977 | Coleman . |
| 4,066,426 | 1/1978 | Maher . |
| 4,101,952 | 7/1978 | Burn . |
| 4,107,759 | 8/1978 | Maher . |
| 4,135,224 | 1/1979 | Maher . |
| 4,168,520 | 9/1979 | Coleman . |
| 4,181,923 | 1/1980 | Tatsumi et al. ................... 361/293 |
| 4,188,651 | 2/1980 | Dornfeld . |
| 4,192,698 | 3/1980 | Jacobsen . |
| 4,193,106 | 3/1980 | Coleman . |
| 4,216,523 | 8/1980 | Harford . |
| 4,219,866 | 8/1980 | Maher . |
| 4,223,369 | 9/1980 | Burn . |
| 4,247,881 | 1/1981 | Coleman . |
| 4,266,265 | 5/1981 | Maher . |
| 4,283,753 | 8/1981 | Burn . |
| 4,308,570 | 12/1981 | Burn . |
| 4,312,026 | 1/1982 | Iwaya et al. . |
| 4,313,157 | 1/1982 | Fink ................... 361/321 |
| 4,324,750 | 4/1982 | Maher . |
| 4,356,529 | 10/1982 | Kopel . |
| 4,397,886 | 8/1983 | Burn et al. . |
| 4,419,310 | 12/1983 | Burn et al. . |
| 4,419,714 | 12/1983 | Locke . |
| 4,425,378 | 1/1984 | Maher . |
| 4,430,690 | 2/1984 | Chance et al. . |
| 4,466,045 | 8/1984 | Coleman . |
| 4,486,813 | 12/1984 | Maher . |
| 4,500,368 | 2/1985 | Maher . |
| 4,510,175 | 4/1985 | Burn . |
| 4,513,350 | 4/1985 | Coleman . |
| 4,517,144 | 5/1985 | Brownell et al. . |
| 4,533,974 | 8/1985 | Maher . |
| 4,568,384 | 2/1986 | Maher . |
| 4,630,171 | 12/1986 | Dubuisson et al. ............... 361/321.1 |
| 4,633,366 | 12/1986 | Maher . |
| 4,661,884 | 4/1987 | Seaman . |
| 4,706,163 | 11/1987 | Maher . |
| 4,716,058 | 12/1987 | Morin . |
| 4,758,922 | 7/1988 | Ishigaki et al. ................... 361/330 |
| 4,806,159 | 2/1989 | DeKeyser et al. . |
| 4,831,494 | 5/1989 | Arnold et al. ................... 361/321 |
| 4,852,227 | 8/1989 | Burks . |
| 4,882,650 | 11/1989 | Corah et al. . |
| 4,882,651 | 11/1989 | Maher . |
| 4,898,844 | 2/1990 | Maher et al. . |
| 4,908,338 | 3/1990 | Hutchins et al. . |
| 4,931,901 | 6/1990 | Heron . |
| 4,947,286 | 8/1990 | Kaneko et al. ................... 361/321 |

MONOLITHIC MULTIPLE CAPACITOR

BACKGROUND OF THE INVENTION

This invention is a miniature monolithic multiple capacitor that is useful in small electronic circuits and that is particularly adapted for use with hearing aids designed to be inserted in the external acoustic meatus or aural canal. The invention is also directed to a method of making the monolithic multiple capacitor. In particular, it is a method of and a means for providing a device that contains many or all of the capacitors necessary for a circuit, especially an analog circuit, that fits into a relatively small space such as the external aural canal of a human being.

The development of integrated circuits has made it possible to place many circuit elements in a single semiconductor chip. Where part or all of the circuit is an analog circuit, the capacitor or capacitors that are needed for the circuit are often difficult or impossible to achieve as elements of an integrated circuit. The result has usually been to add required capacitance as individual external capacitors that take up a significant amount of volume in the circuit. This is particularly a problem in hearing aids that are designed to be inserted in the external acoustic meatus or aural canal of the ear. Such hearing aids are attractive to users because the hearing aids are relatively invisible to the observer who is thus unaware that someone is using a hearing aid. There are also operating advantages to be gotten from putting a hearing aid in the aural canal to couple acoustically to the tympanum or eardrum. The average diameter of the external acoustic meatus, however, is small enough to present a considerable challenge to the designer of a hearing aid to fit there all required components, including a microphone, amplifier, speaker, battery, circuit assembly, and the like.

Monolithic multilayer single capacitors are known. They are typically formed in groups of hundreds or thousands by printing a layer of conducting ink on a sheet of green tape or greenware, which is a thin layer of a powdered ceramic dielectric material held together by a binder that is typically organic. Such sheets, typically although not necessarily of the order of five inches by five inches, can be stacked to form 800 or more monolithic ceramic capacitors. After thirty to one hundred or so such layers are stacked, they are compressed and cut apart into individual capacitors. Heating the compressed individual device according to a desired time-temperature profile then drives off the organic binder and sinters or fuses the powdered ceramic material into a monolithic structure. The printed layers are then connected electrically in a pattern that provides one or more parallel-plate capacitors. The external electrical connections are thus made after the compressed combination is sintered or fused. Proper selection of the dielectric constant and loss tangent of the ceramic material, the separation of the conducting layers from each other by the ceramic material, and the surface area of the conducting layers makes it possible to design a capacitor to a predetermined value of capacitance, voltage rating, and loss tangent.

An example of a structure similar to that described above is given in U.S. Pat. No. 4,661,884, entitled "Miniature, Multiple Layer, Side Mounting High Frequency Capacitor," issued Apr. 28, 1987. The '884 patent teaches a single capacitor in which external conductive terminals are brought out to be soldered to a circuit board. A somewhat similar example is given by U.S. Pat. No. 4,312,026, entitled "Chip Ceramic Capacitor," issued Jan. 19, 1982. The '026 patent teaches in one embodiment a plurality of conducting layers separated by a dielectric material and connected together alternately on opposite sides of the structure to form a capacitor with interleaved conducting plates. Both the '884 patent and the '026 patent teach structures that comprise individual capacitors and not multiple capacitors as disclosed and claimed here.

A structure containing multiple capacitors is taught by U.S. Pat. Nos. 4,419,714, entitled "Low Inductance Ceramic Capacitor and Method for its Making," issued Dec. 6, 1983, and 4,430,690, "Low Inductance MLC Capacitor with Metal Impregnation and Solder Bar Contact," issued Feb. 7, 1984. The abbreviation "MLC" is defined in the '690 patent to mean multilayered ceramic, formed by interspersing layers of green tape or greenware with electrical conductors. Green tape or greenware is a layer of powdered ceramic material held together in the form of a tape or other thin structure by an organic binder. After the green tape is compressed, heating it drives off the binder and sinters or fuses the ceramic material into a monolith.

Both the '714 patent and the '690 patent are directed to forming layers of parallel-plate capacitors with different interconnections. The '714 patent teaches external connections that are brought out to bus bars that can be connected externally to select desired values of capacitance for a particular circuit. The '690 patent teaches external connections that are designed to be soldered to a plurality of solder bars to mount the capacitors to a circuit board.

A hearing aid comprises a battery or other portable energy source, a microphone, an amplifier, and an output transducer or receiver. The amplifier may include some desired form of signal processing. In contrast to the capacitors described above, which are described as being mounted to circuit boards, dimensions in the human external aural canal are small enough that it is barely possible to fit an additional substrate or integrated circuit containing the required electronics, and the necessary external capacitance, into the canal. It would therefore be useful to have a capacitor or array of capacitors that can be bonded directly to the chip that contains the integrated circuit to make a compact package.

An additional problem exists with multilayer ceramic structures having a plurality of capacitors. This is the fact that there is stray or parasitic capacitance between electrical conductors that are not connected by conducting paths but that are separated by, or adjacent in, dielectric media. One way to reduce or control such stray capacitance is to place ground planes at appropriate locations. This generally has the effect of splitting a single parasitic capacitance into two larger series parasitic capacitances such that the net value of capacitive coupling is typically less than that of the single parasitic element without the ground plane. This is appropriate with capacitors that float electrically in circuit use; this occurs when neither side of the capacitor is to be grounded. However, each of these series capacitors provides a new stray capacitance that couples to the ground node, and this capacitance is typically larger than the original parasitic coupling between the conductive paths without the ground plane; it is usually undesirable. Whatever measures are taken, it is impossible to eliminate all stray capacitance between pairs of electrical conductors in a monolithic ceramic capacitor.

One of the elements of stray capacitance that is typically especially noticeable in a monolithic multiple ceramic capacitor is the capacitance between adjacent terminals. A common way to reduce or control this stray capacitance is to drill holes in the monolithic material, either before or after it is fired, to insert air, which has a relatively low permittivity, in the direct path between the terminals. This has the disadvantage of limiting the distance that the air goes into the material to a radius that is less that half the separation of the terminals, and thus of limiting the number of external connections that can be made along an edge by requiring that the external connections be separated by the radius of the drill.

It would be an advantage to accept the fact that parasitic capacitance will exist in a multi element device and to use some or all of the separate parasitic capacitances as circuit elements. This could be done by designing the circuit for desired values of parasitic capacitance, by designing a circuit to use the values of parasitic capacitance that exist as a result of the design of the main capacitance values, or by a combination of these.

It is an object of the present invention to provide a better monolithic multiple capacitor.

It is a further object of the present invention to provide a monolithic multiple capacitor with reduced or controlled capacitance between adjacent terminal tabs.

It is a further object of the present invention to provide a monolithic multiple capacitor in which stray capacitance between pairs of terminals is used to form useful circuit elements.

It is a further object of the present invention to provide a monolithic multiple capacitor in which stray capacitance between pairs of terminals is set to controlled values to form useful circuit elements.

It is a further object of the present invention to provide a monolithic multiple capacitor that is adapted to serve as a mount on the top, bottom, or both, for one or more integrated circuits or surface-mounted components with a lower amount of coupling through stray capacitance between adjacent capacitors.

It is a further object of the present invention to provide a monolithic multiple capacitor that is adapted for use as part of a hearing aid to be inserted in the external aural canal.

It is a further object of the present invention to control values of stray capacitance in a monolithic multiple ceramic capacitor to repeatable values by separating regions of the monolithic structure from other regions by a layer or layers of ceramic material having dielectric constants lower than the dielectric constant of the ceramic material used to form the capacitors in the device.

Other objects will become apparent in the course of a detailed description of the invention.

SUMMARY OF THE INVENTION

A monolithic multiple ceramic capacitor is made by interspersing layers of green tape containing ceramic powder in a binder with printed layers of electrical conductors, compressing the layers of green tape, cutting the resulting structure into individual arrays of multiple capacitors, and heating the compressed layers of green tape to expel the binder and sinter or fuse the ceramic powder into a monolith. Edge electrical connections link the conducting layers in predetermined patterns to provide external connections to the capacitors after the green tapes are compressed and heated. Use of parasitic or stray capacitance between pairs of external terminals provides additional useful values of capacitance that can become part of an external circuit, and that can be adjusted to a desired value. Unwanted stray capacitive coupling between adjacent terminals is reduced by making slots by saw cuts or the like in the sintered or fused material, thereby castellating the terminals with a separation that is independent of the depth of a saw cut. Unwanted stray capacitance between elements inside the capacitor and between these elements and conductors on the surface of the device is reduced or controlled by placement of ground planes and by using appropriately placed layers of green tape made of powdered ceramic materials having relatively low dielectric constants.

DETAILED DESCRIPTION OF THE INVENTION

Figure 1:
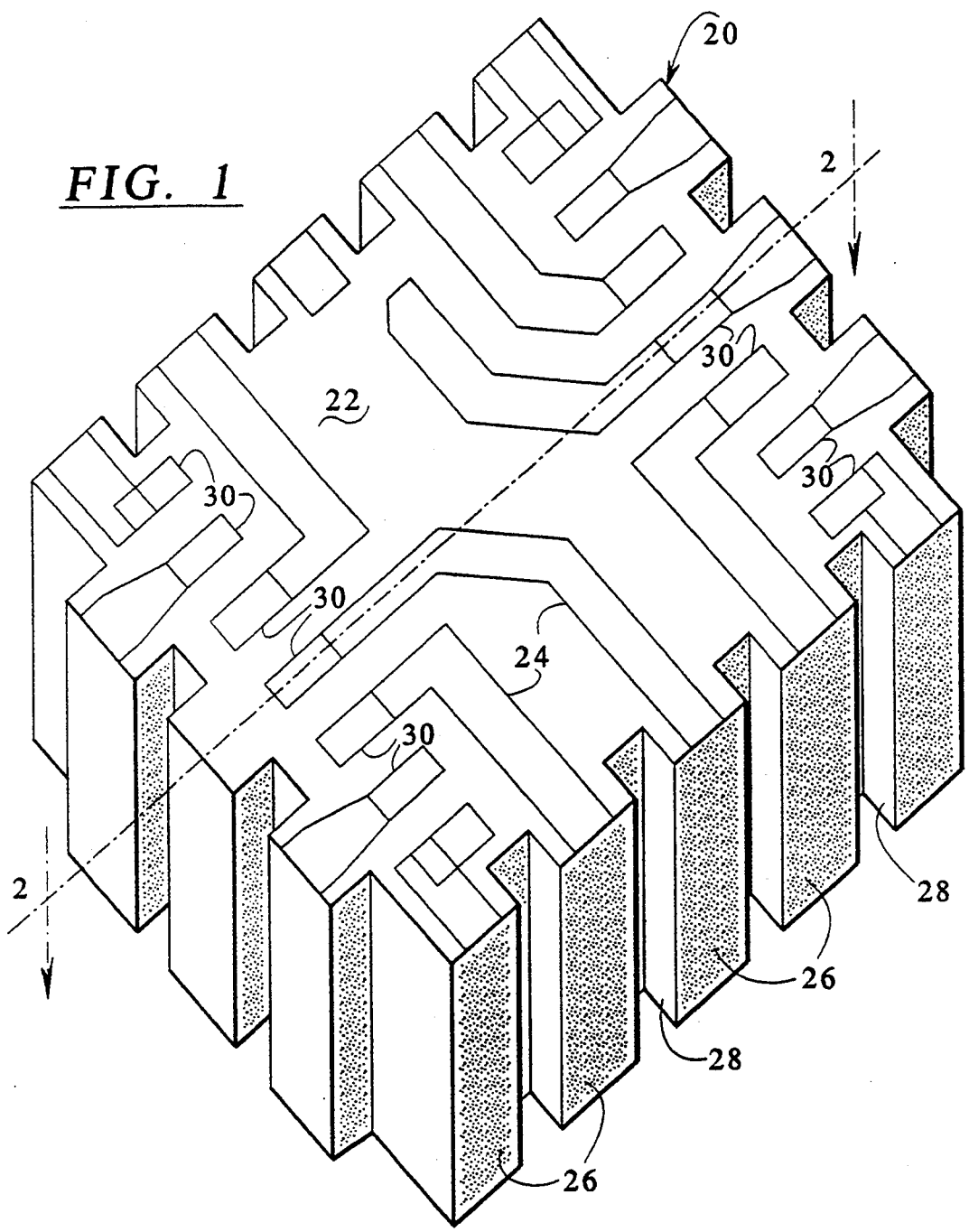
FIG. 1 is a perspective view of a monolithic multiple ceramic capacitor according to the present invention.

FIG. 1 is a perspective view of a monolithic multiple ceramic capacitor 20 according to the present invention. In FIG. 1, a surface 22 will be referred to for convenience as the top of the capacitor 20, although it should be evident that the capacitor 20 has no preferred orientation that represents the top or the bottom. The capacitor 20 can be used in any configuration, but the surface 22 is typically the last to be formed, and is often the top during fabrication. The surface 22 contains a number of conductors 24, printed on the surface 22 by a screening process or the like, that represent electrical connections to be made when the capacitor 20 is assembled into an electrical circuit. Each of these conductors 24 is connected to an edge 26 that has been metallized, typically by dipping it in a conducting ink, to connect to electrical conductors inside the capacitor 20 that are not shown here.

Adjacent edges 26 of FIG. 1 are separated by slots 28 that are typically saw cuts, made after the capacitor 20 has been fired. Saw cuts allow the width of the slots 28 to be kept independent of their depth, so that the capacitance between adjacent terminals is controlled by two independent variables, the width of the saw and the depth of the cut. The use of saw cuts to make the castellations resulting from the slots 28 allows the slots 28 to be placed closer to each other than they could be if they were produced by drilling, and it allows the depth of individual cuts to be varied from those of adjacent ones if desired. In addition to these functional advantages, the use of saw cuts provides production advantages that make it possible to produce capacitors better and faster than other methods of castellating the edge connections.

Portions of some of the conductors 24 are placed to serve as tabs 30 to which to connect the pins of an integrated-circuit (IC) chip, surface-mounted component, or printed resistor, none of which is shown here. An IC is typically wire-bonded while a surface-mounted component will probably be soldered. Since the capacitor 20 may be used with a miniature electronic circuit such as a hearing aid that fits in a human ear, its length and width are typically of the order of 3 to 4 millimeters and its thickness is typically of the order of 1 or 2 millimeters. Other applications may call for different dimensions, either larger or smaller. A bottom surface of the capacitor 20 that is not shown here can also be used to support an IC or a surface-mounted component as described for the surface 22.

Figure 2:
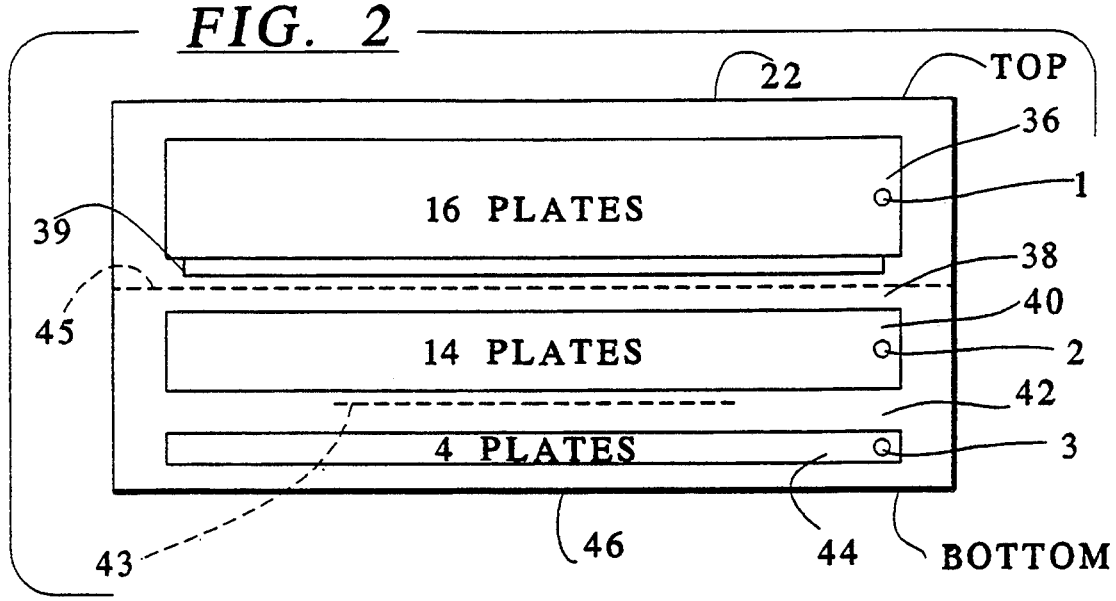
FIG. 2 is a schematic sectional side view of the capacitor of FIG. 1 taken along section lines 2—2 of FIG. 1.

FIG. 2 is a schematic sectional side view of the capacitor of FIG. 1 taken along section lines 2—2 of FIG. 1. In FIG. 2, the surface 22 is formed of several layers, typically three, of green tape. Green tape is a suspension of powdered ceramic material such as barium titanate, strontium titanate, or other ceramic material selected for its dielectric and loss properties, bonded together by a binder that is typically organic. The green tape is typically of the order of 0.8 to 1.2 mils (about 80 to 120 micrometers) in thickness before it is compressed and baked. Baking the green tape sinters the ceramic material and drives off the binder to leave a monolithic ceramic material. The green tape is made with a binder of a substance such as polyvinyl butyrol or an acrylic material.

Below the surface 22 in FIG. 2 is a region 36 that contains a number of conductors printed on green tapes which are then compressed, cut apart, and sintered or heat-fused. The conductors are disposed in patterns that will be shown later in detail. In the embodiment of the invention that was built and tested, the region 36 contained sixteen conductors interleaved and interconnected to comprise capacitor plates. A region 38 contains additional layers of dielectric material, some of which may be of a dielectric constant selected to reduce or control parasitic capacitance or coupling. The region 38 may also contain a ground plane 39 to reduce stray or parasitic capacitance between the region 36 and a region 40 that contains fourteen conducting surfaces interleaved and interconnected to comprise a second capacitor. A region 42 may consist entirely of ceramic material or it may, as shown, include a conducting layer to serve as another ground plane 43. A region 44 contains conducting surfaces separated by dielectric material to form a third capacitor. A bottom surface 46 of ceramic material completes the major structure of the capacitor 20.

A sheet 45 of ceramic material having a lower dielectric constant, of the order of 100, than that of the ceramic material used in the capacitors is shown in FIG. 2 as a dashed line. When a single sheet such as sheet 45 was used in making a capacitor, the stray capacitance between the nearest capacitor and ground was reduced to about 25% of its former value.

Figure 3:
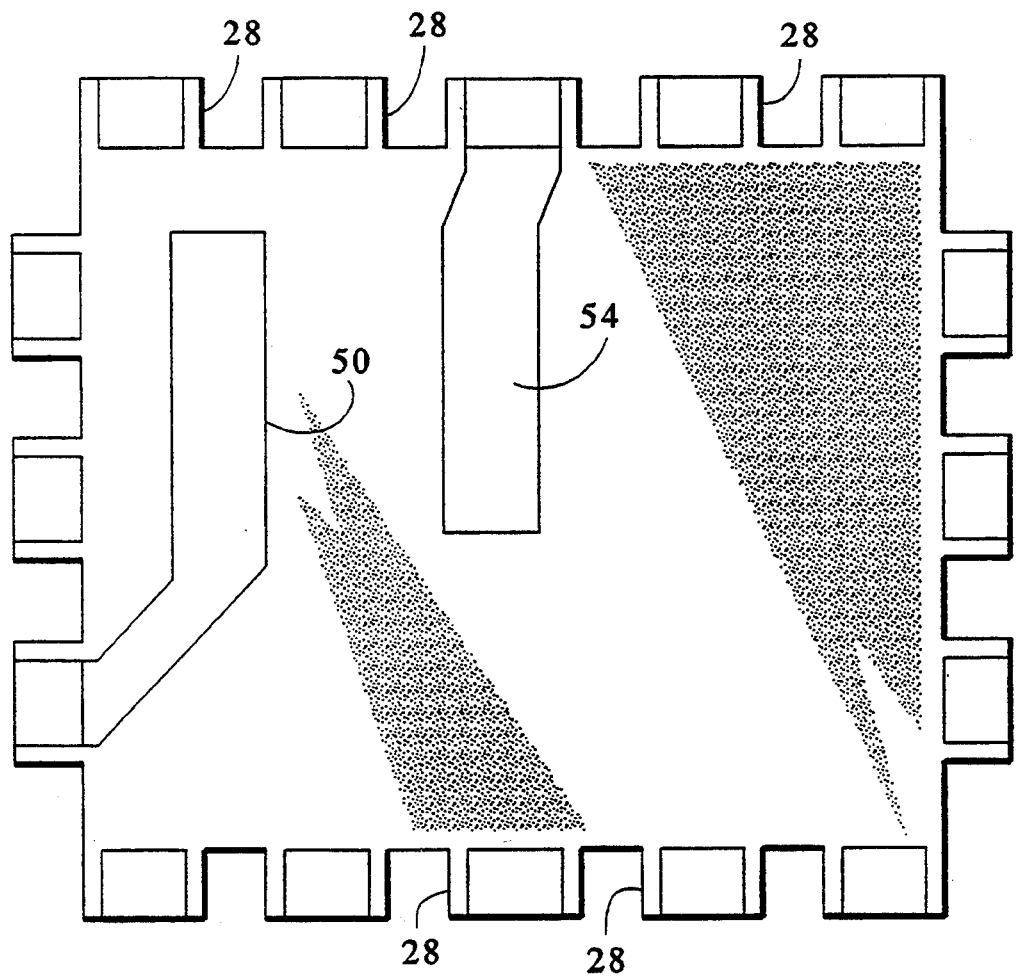
FIG. 3 is a plan view of the metallization of the bottom surface of the capacitor of FIG. 1.

FIG. 3 is a plan view of the metallization of the bottom surface of the capacitor 20 of FIG. 1. As mentioned earlier, the term "bottom" is relative and is used for convenience; the capacitor 20 can be used in any orientation. In FIG. 3, the slots 28 of FIG. 1 can be seen from the bottom. A conductor 50 is connected to a conducting edge 52 and thus through the edge 52 to one of the tabs 30 that are on the surface 22 of FIG. 1. Another conductor 54 is connected to a conducting edge that is not shown but that similarly makes a connection with one of the tabs 30. The conductors 50 and 54 are available to make external connections to a battery, microphone, or loudspeaker in the case of a hearing aid and to whatever external components may be needed in another miniature electronic application.

Figure 4:
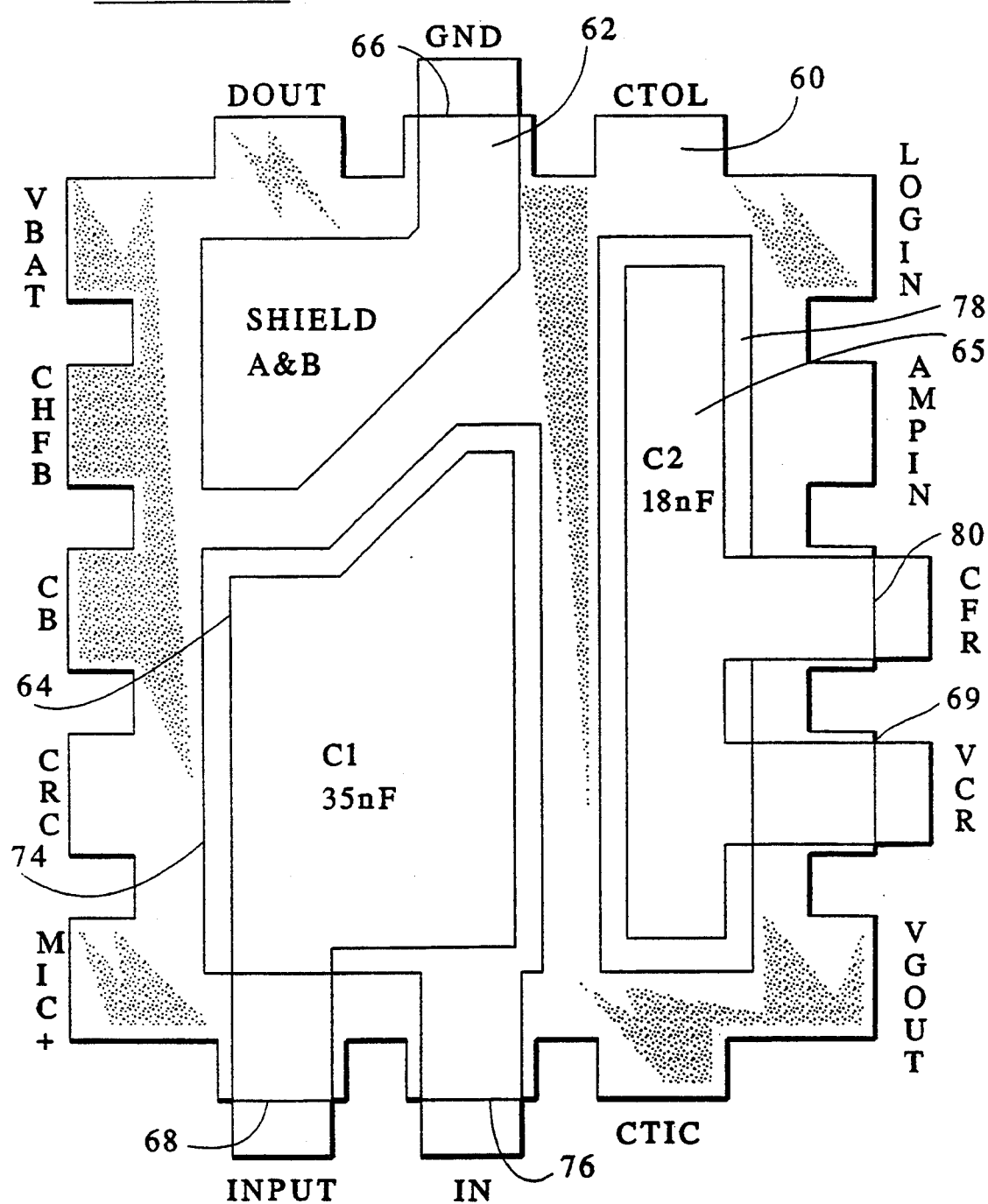
FIG. 4 is a plan view of the metallization of level 1 of FIG. 2.

FIG. 4 is a plan view of the metallization of level 1 of FIG. 2. In FIG. 4, a surface 60 is a ceramic which was formed by sintering a green tape upon which several conducting layers are shown for purposes of convenience and to illustrate the complete layout of each capacitor. The capacitors are constructed by depositing layers alternately as follows. First, a ground 62 and a plate 65 are deposited by screening or a similar method on the surface 60. The ground 62 is connected to an edge 66 which as been seen is connected to one of the tabs 30 of FIG. 1, and the plate 65 is similarly connected to an edge 69 and to another of the tabs 30. A layer of ceramic material is placed over the ground 62 and the plate 64 to form a new surface 60 upon which conducting ink is deposited to form the other plates of several capacitors. Another ground 62 is deposited as shown to form a shield in each layer and to connect to the edge 66. A plate 74 forms a capacitor with the plate 64, and makes an external connection to an edge 76. A plate 78 forms with the plate 65 another capacitor that makes an external connection at an edge 80. As indicated in FIG. 2, layers containing the ground 62 and the plates 64 and 65 are alternated with layers containing the ground 62 and the plates 74 and 78 for a total of sixteen plates to produce capacitors having the desired values of capacitance. Alternate rows of plates are connected together at the edges 66, 68, 69, 76, and 80 respectively. In the embodiment of the invention that has been built and tested, the capacitance between the edges 68 and 76 was 35 nanofarads and the capacitance between the edges 69 and 80 was 18 nanofarads. The structure shown here will exhibit parasitic capacitances between the edges 66 and 68, 66 and 69, 66 and 76, 66 and 80, 68 and 69, 68 and 80, 69 and 76, and 76 and 80, in addition to the capacitances between adjacent edges. At least some of these represent potentially usable values of capacitance. For some or all of these values of capacitance, changes in the ceramic material selected so as to change the dielectric constant of the material provides the possibility of changing the amount of the capacitance to a desired value for use as a circuit element.

Figure 5:
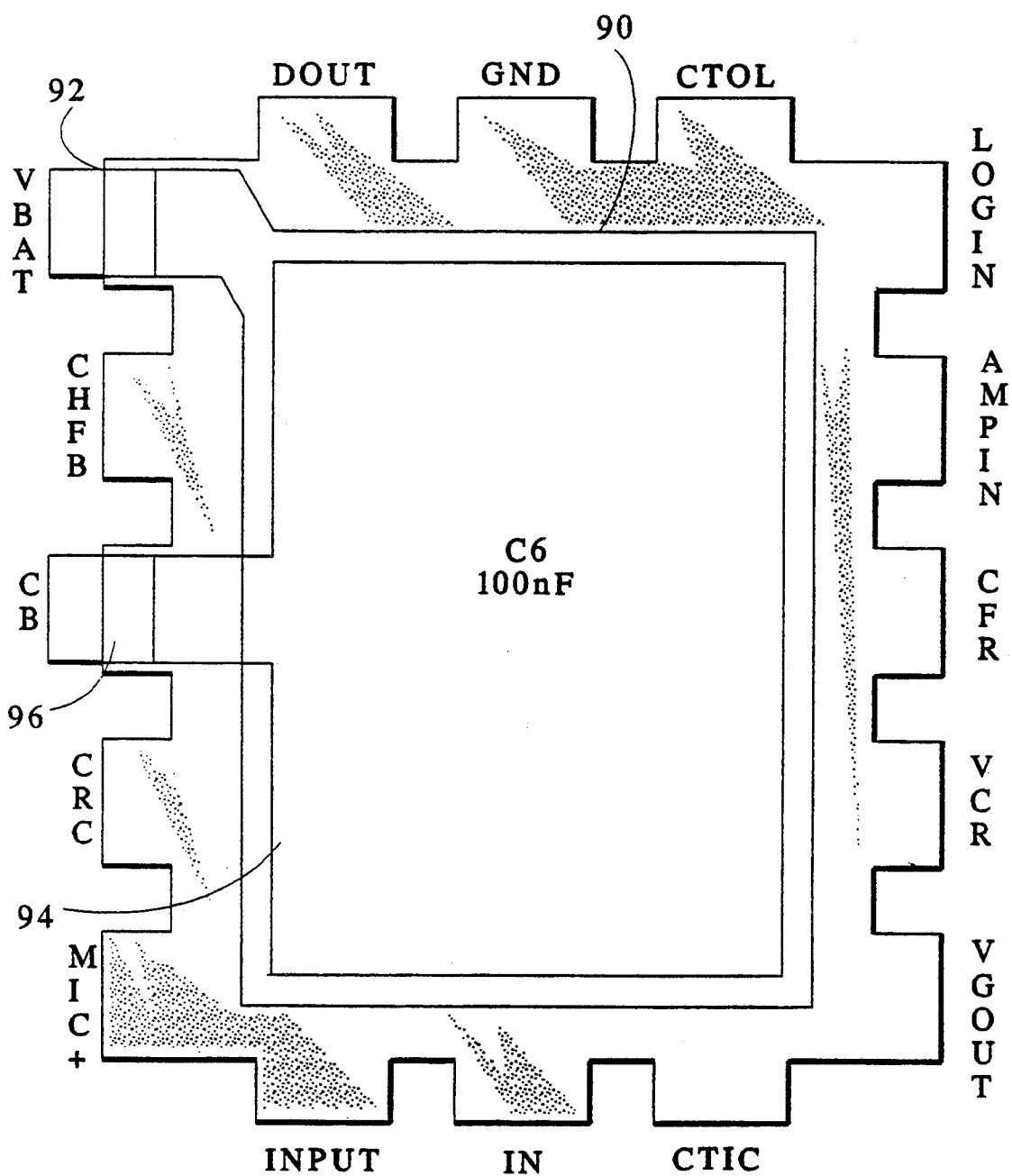
FIG. 5 is a plan view of the metallization of level 2 of FIG. 2.

FIG. 5 is a plan view of the metallization of level 2 of FIG. 2. In FIG. 5, a plate 90 is connected to an edge 92 on one layer and a plate 94 is connected to an edge 96 in the next succeeding layer. As noted in FIG. 2, fourteen such plates are stacked to create between the edges 92 and 96 a capacitor having a value of 100 nanofarads. As with the capacitors of FIG. 4, stray capacitance exists between the edges 92 and 96 and other such edges.

Figure 6:
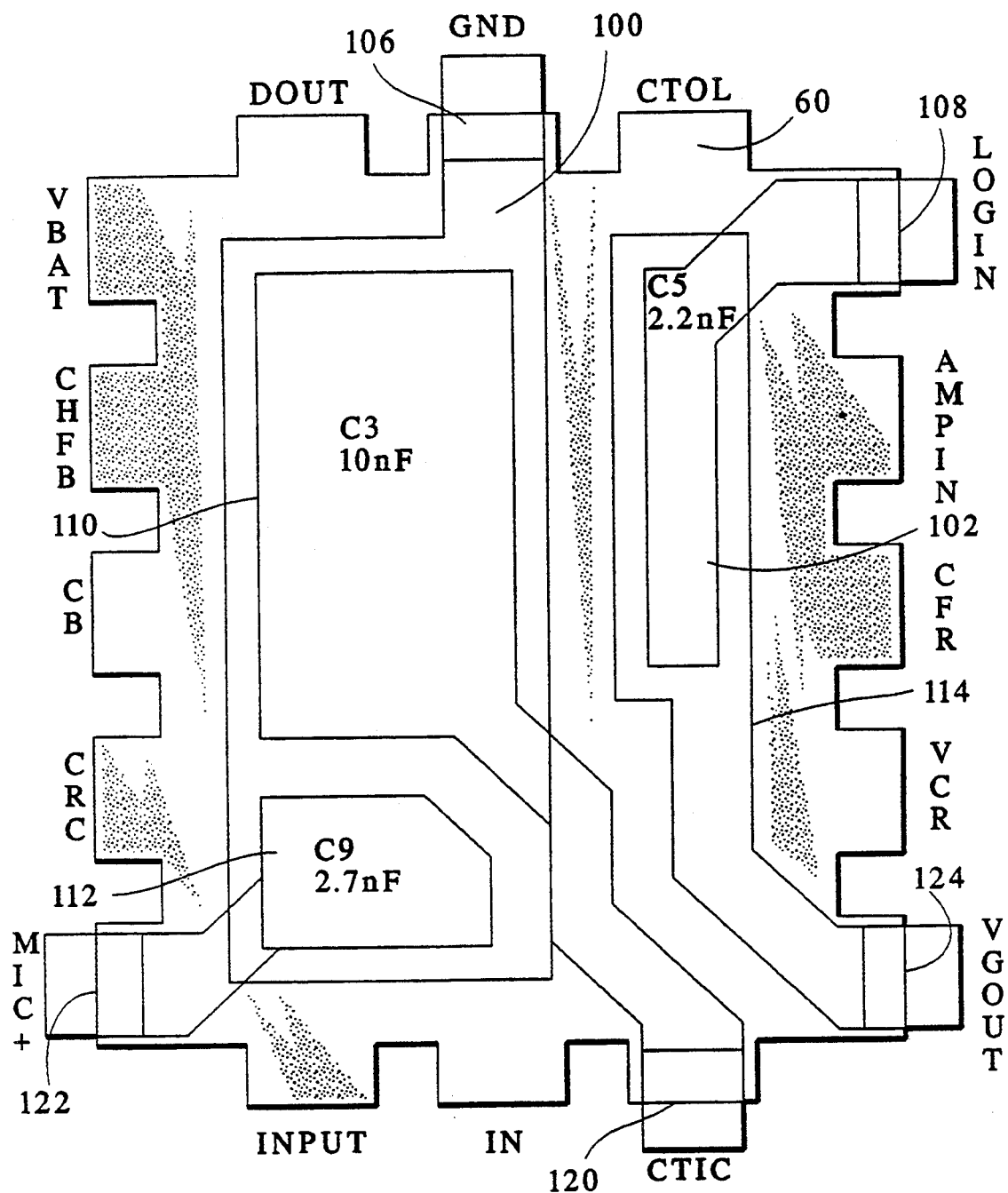
FIG. 6 is a plan view of the metallization of level 3 of FIG. 2.

FIG. 6 is a plan view of the metallization of level 3 of FIG. 2. In FIG. 6, the surface 60 is another layer of ceramic material, first deposited as green tape and then heated to sinter the ceramic particles. Printed on the surface 60 when it is green tape are a ground 100 and a plate 102. The ground 100 is connected to an edge 106 and the plate 102 is connected to an edge 108. The ground 100 and the plate 102 are covered by a layer of ceramic material upon which are deposited a conducting layer 110, a conducting layer 112, and a conducting layer 114. The conducting layer 110 is brought out to connect to an edge 120; the conducting layer 112 is connected to an edge 122; and the conducting layer 114 is connected to an edge 124. The layers 110 and the grounds 100, together with the dielectric ceramic material separating them, form a capacitor between the edges 106 and the edge 120. The layers 112 and the grounds 100 form another capacitor having connections at the edges 106 and 122. The layers 102 and 114 form a capacitor between the edges 108 and 124. In the embodiment of the invention that has been built, four layers of plates were deposited to produce a capacitance between the edges 106 and 120 of 10 nanofarads. The capacitance between the edges 106 and 122 was 2.7 nanofarads and the capacitance between the edges 108 and 124 was 22 nanofarads. As before, parasitic capacitances exist between the edges associated with the ground and layers that are not paired above.

Figure 7:
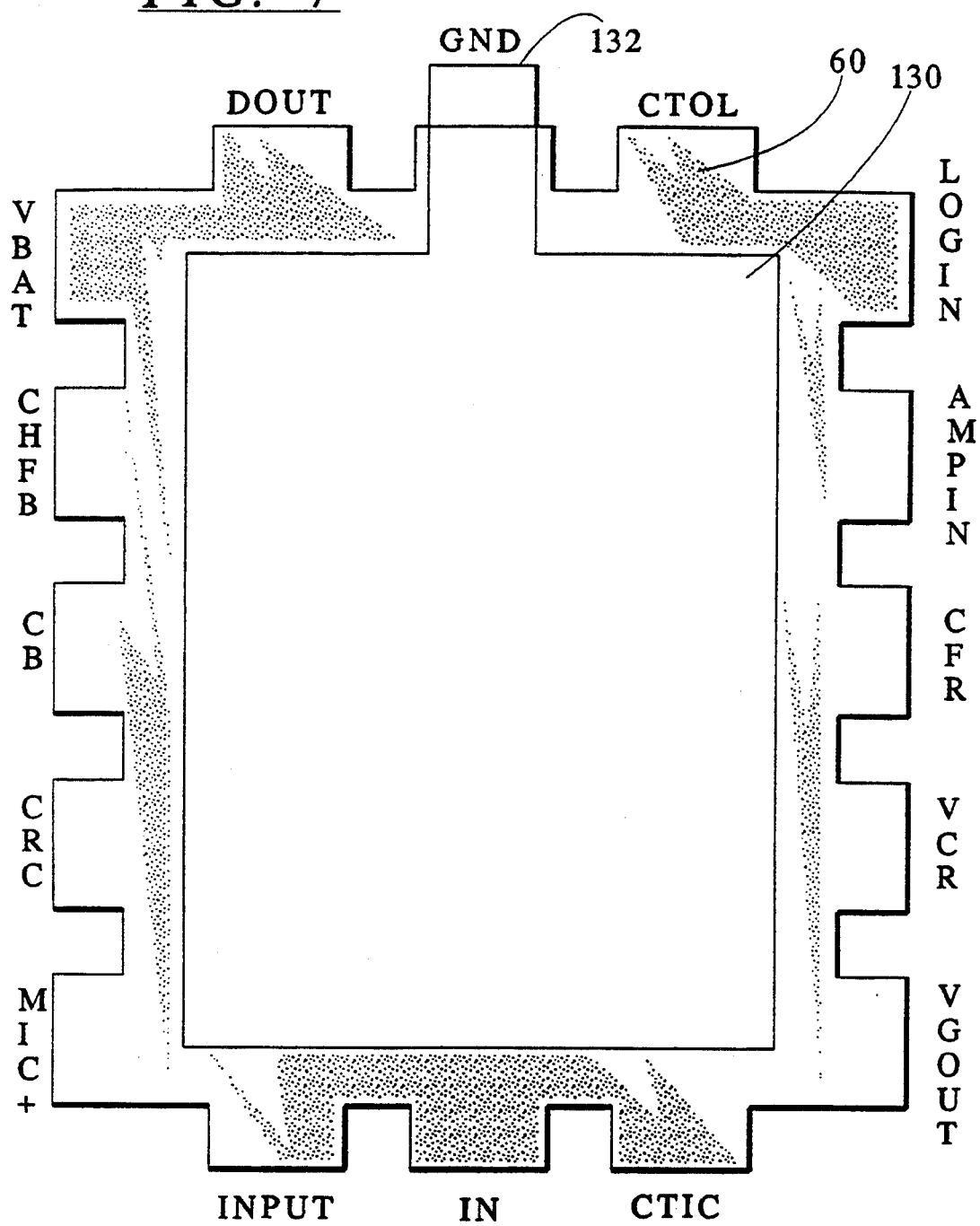
FIG. 7 is a plan view of the metallization of the ground plane of FIG. 2.

FIG. 7 is a plan view of the metallization of the ground plane or ground planes of FIG. 2. In FIG. 7, the ceramic surface 60 is largely covered by a ground plane 130 that may be used to isolate the capacitors in any of the layers from those in other layers to reduce the parasitic capacitances between pairs of terminals associated with the conductors in different sets of layers. The ground plane 130 is connected to an edge 132 that is also common to the edge 106 of FIG. 6 and the edge 66 of FIG. 4.

Figure 8:
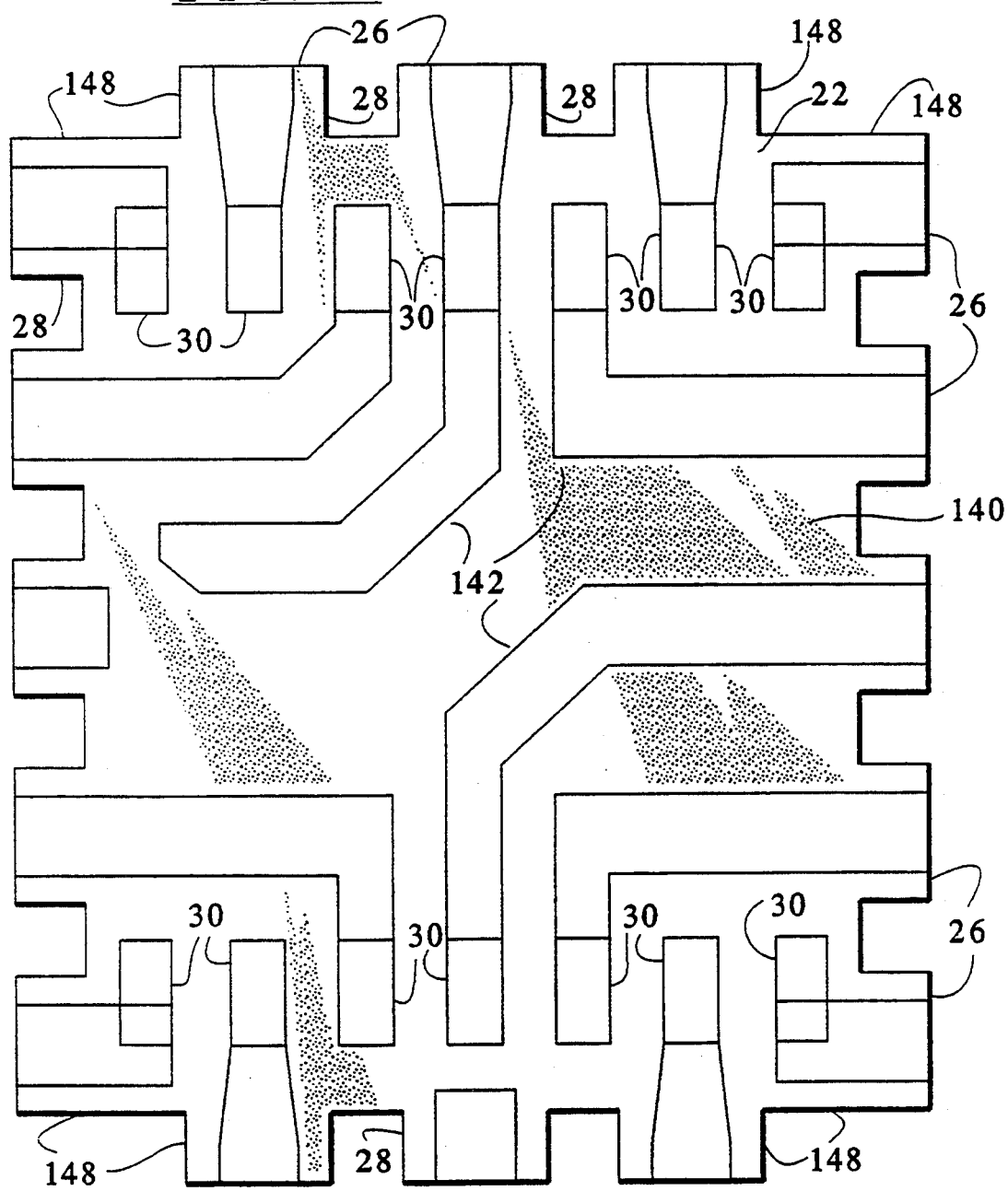
FIG. 8 is a plan view of the metallization of the top surface of the capacitor of FIG. 1.

FIG. 8 is a plan view of the metallization of the top surface of the capacitor of FIG. 1. In FIG. 8, the surface 22 includes an unmetallized ceramic region 140 upon which are printed a number of electrical conductors 142. Fourteen separate regions of the conductors 142 are aligned to include the tabs 30 which serve as connection points to mount a fourteen-pin IC chip that is not shown here. It would be equally possible to mount there other IC chips or components by wire bonding or flip-chip technology. Each of the tabs 30 is typically connected to one of the edges 26 which make electrical connections to regions inside the capacitor 20 as shown. The slots 28 both insulate adjacent edges 26 from one another and reduce the capacitance between adjacent edges 26 by inserting an air dielectric in a part of the path between adjacent edges 26. Corner cuts 148 separate edges 26 that are in the corners. The capacitor 20 that was built to practice the present invention was designed to fit the terminals of a fourteen-pin custom IC chip. It would have been possible to change the dimensions of the surface 22 of FIG. 8 to accommodate a different pin layout of an IC chip. It would also have been a simple matter to make bridging connections between elements on the surface 22 by printing a bridging conductor on a layer of green tape that is separated from the conductors on the surface 22 by a layer of green tape. In addition, the surface 22 shows only conducting paths. It would also have been a simple matter to print one or more thick-film resistors on the surface 22 to become a part of an electronic circuit that would be miniaturized.

Figure 9:
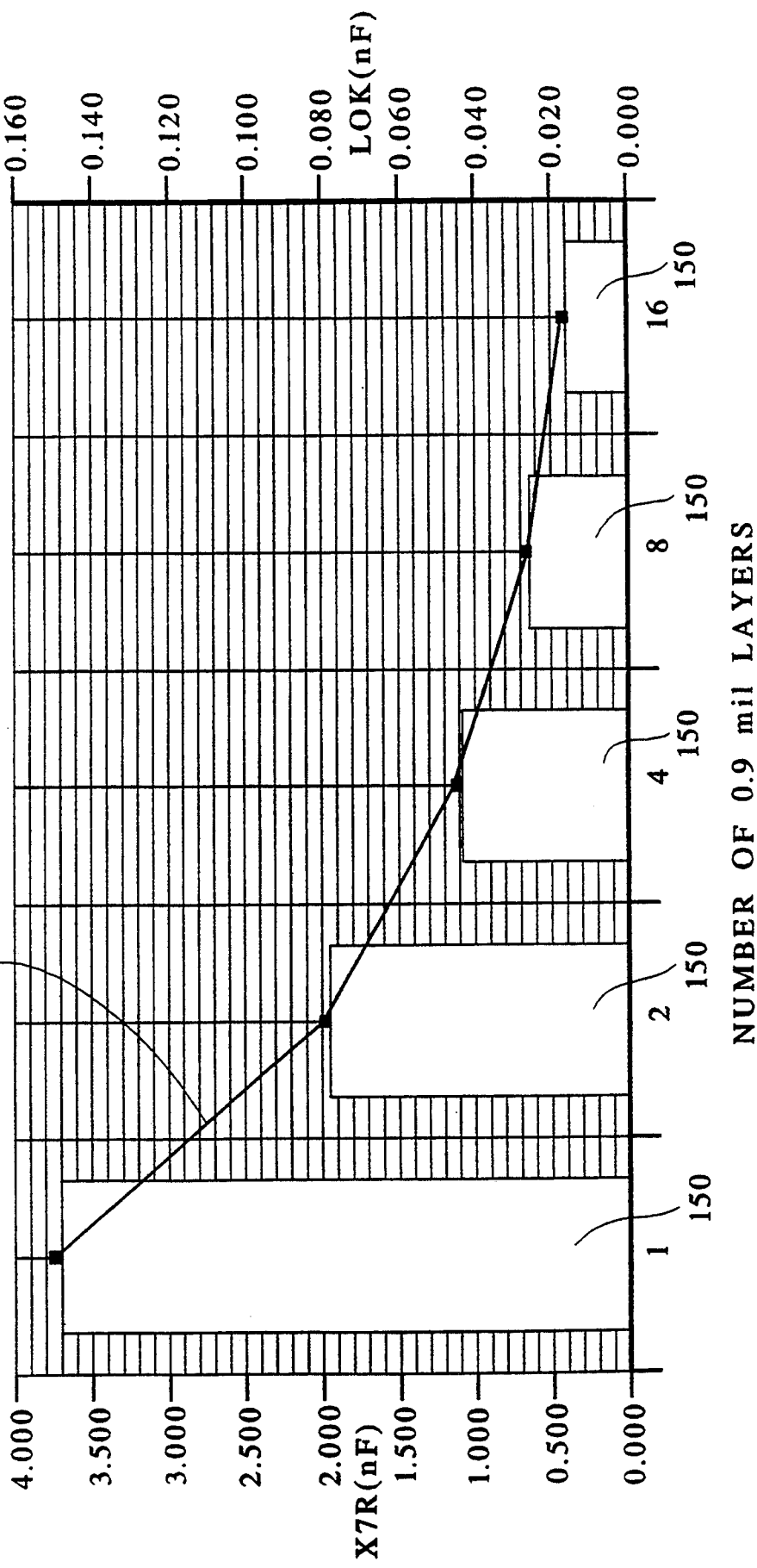
FIG. 9 is a plot of capacitance between an outer capacitor plate and an infinite ground plane as a function of the number of layers of green tape for two different ceramic dielectrics.

FIG. 9 is a plot of capacitance between an outer capacitor plate and an infinite ground plane as a function of the number of layers of green tape for two different ceramic materials having different dielectric constants. In FIG. 9, a curve 150 represents capacitance between an outer conductor and a ground plane at infinity as a function of the number of layers of green tape made of a material having a dielectric constant of about 2600, sintered as described earlier, and a curve 152 represents capacitance between the outer conductor and a ground plane at infinity as a function of the number of layers of green tape made of a material having a dielectric constant of about 100, similarly sintered. It can be seen from FIG. 9 that the capacitance between the outer conductor and ground can be set at a desired value by selecting an appropriate number of layers of a particular ceramic material or of a combination of the ceramic materials shown.

The capacitor of the present invention was made of a number of commercially available components. The ceramic material used for most of the capacitor was a barium titanate compound that was either Tam Ceramics Type 262L or Tam Ceramics Type XL103. Tam Ceramics Type 262L has a dielectric constant of about 2600 and Tam Ceramics Type XL103 has a dielectric constant of about 9000. Other commercially available ceramic materials could be used as well. To help control parasitic capacitance, layers of green tape were made with Tam Ceramics Type CL90, which has a dielectric constant of about 90. Two layers of green tape of the lower dielectric constant were placed above the upper level, eight were placed above the middle level, two were placed above the lower level, and two were placed below the lower level. The structure disclosed here, including the use of the low-dielectric layers and the slots 28 of FIG. 8 provided the values of capacitance shown in the Table.

TABLE

| Level in FIG. 2 | Capacitor number | Capacitor value |
| --- | --- | --- |
| 1 | 1 | 35 nf |
| 1 | 2 | 22 nf |
| 2 | 6 | 100 nf |
| 3 | 3 | 10 nf |
| 3 | 5 | 3.0 nf |
| 3 | 9 | 3.0 nf |

Figure 10:
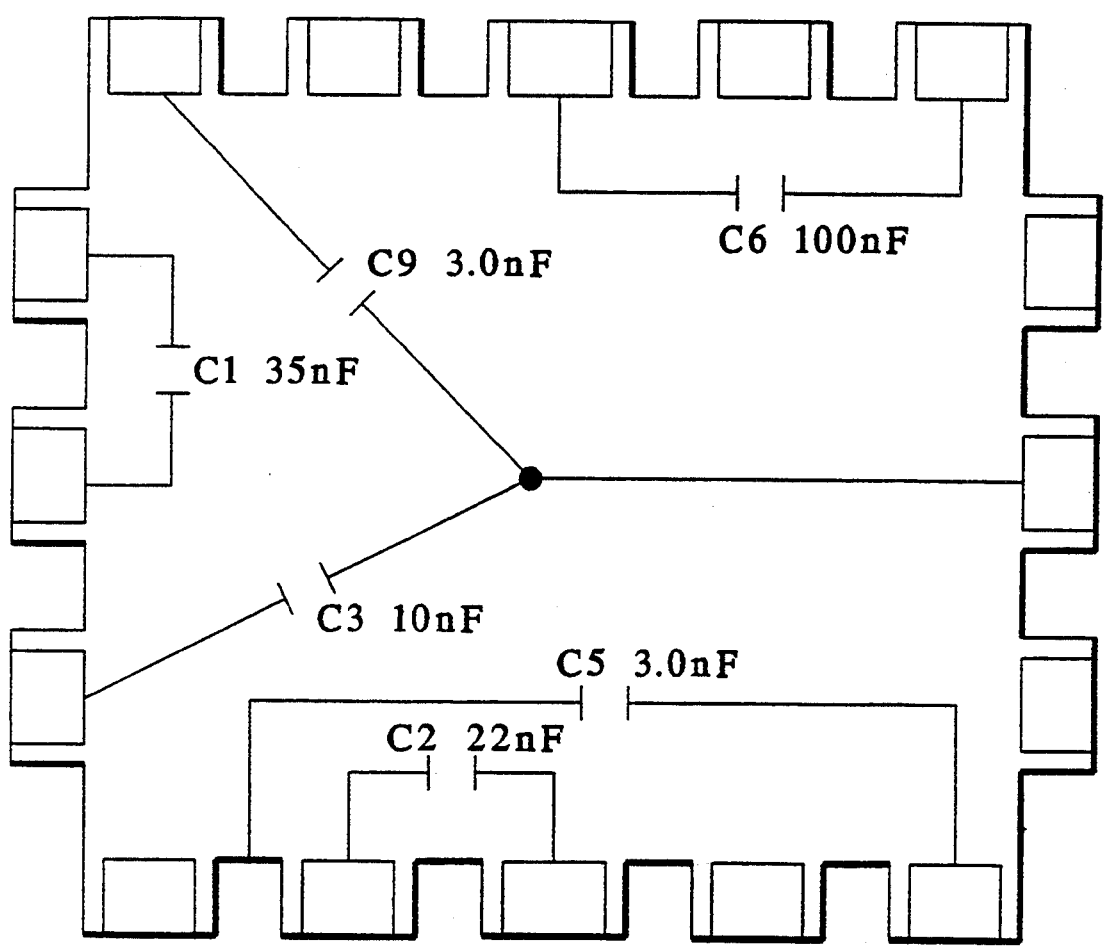
FIG. 10 is a view of the bottom of the capacitor as shown in FIG. 2 with the capacitors of the Table associated with the external terminals to which they are brought out.

FIG. 10 is a view of the bottom of the capacitor as shown in FIG. 2 with the capacitors of the Table associated with the external terminals to which they are brought out. Other values of capacitance representing stray or parasitic capacitances between other pairs of terminals can also be used as circuit elements and can be adjusted in value during manufacturing as described above.

The preceding disclosure is intended to enable the practice of the invention by one of ordinary skill in the arts that are relevant to the invention, and discloses as the preferred embodiment of the invention the best mode presently known to the inventors for practicing the invention. The disclosure is intended to be illustrative and not limiting, and the scope of the invention should be limited only by the scope of the appended claims.

I claim:

1. A monolithic multiple capacitor containing a plurality of capacitors with reduced parasitic capacitance between adjacent external connections in the monolithic multiple capacitor, the monolithic multiple capacitor comprising:
  a. a plurality of first layers of sintered ceramic material disposed to form a bottom electrically insulating section;
  b. a plurality of second layers of ceramic material, each of the second layers including a first conducting layer disposed to form a first plate of a first capacitor, the first conducting layer brought to a first location at an edge of the second layer of ceramic material to make an external connection;
  c. a plurality of third layers of ceramic material, each of the third layers including a second conducting layer disposed adjacent to one of the first layers of ceramic material to form a second plate of the first capacitor in combination with each of the first conducting layers, the second conducting layer brought to a second location at an edge of the third layer of ceramic material to make an external connection at a location different from the edge of the first conducting layer;
  d. a plurality of fourth layers of ceramic material each of the fourth layers including a third conducting layer disposed to form a first plate of a second capacitor, the third conducting layer brought to a third location at an edge of the fourth layer of ceramic material to make an external connection, the third location being different than the first and second locations;
  e. a plurality of fifth layers of ceramic material, each of the fifth layers including a fourth conducting layer disposed adjacent to the fourth layers of ceramic material to form a second plate of the capacitor in combination with each of the first conducting layers, the second conducting layer brought to a fourth location at an edge of the fifth layer of ceramic material to make an external connection at a location different from the first, second, and third locations;
  f. a plurality of sixth layers of sintered ceramic material disposed to form a top electrically insulating section of the monolithic multiple capacitor,
  g. first, second, third, and fourth electrically conducting metal layers disposed substantially perpendicular to each of the layers of sintered ceramic material and interconnecting the external connections at the respective first, second, third, and fourth locations; and
  h. a plurality of rectangular, saw cut slots disposed substantially perpendicular to each of the layers of sintered ceramic material to remove portions of the sintered ceramic material, the rectangular, saw cut slots having a width and a depth, the depth of one or more of the rectangular, saw cut slots being greater than the width thereof thereby to selectively reduce parasitic capacitance between adjacent electrical connections.

2. The monolithic multiple capacitor of claim 1 wherein the ceramic material has a dielectric coefficient of about 2600.

3. The monolithic multiple capacitor of claim 1 wherein the ceramic material has a dielectric coefficient of about 9000.

4. The monolithic multiple capacitor of claim 1 wherein the ceramic material is a composition based on barium titanate.

5. The monolithic multiple capacitor of claim 1 comprising in addition a plurality of layers of ceramic material having a dielectric constant of about 100 disposed in the top insulating section and in the bottom insulating section of the capacitor.

6. The monolithic multiple capacitor of claim 5 comprising in addition a plurality of layers of ceramic having a dielectric constant of about 100 disposed between the capacitors.

7. A monolithic multiple capacitor as claimed in claim 1 and further comprising a ground plane disposed between said first and second capacitors to capacitively isolate said first and second capacitors from one another.

8. A monolithic multiple capacitor as claimed in claim 1 wherein the top electrically insulating section includes tabs electrically connected to at least one of said first or second capacitors and disposed to facilitate connection to a surface mounted integrated circuit device.

9. A monolithic multiple capacitor as claimed in claim 8 wherein the bottom electrically insulating section includes a tabs electrically connected to at least one of said first or second capacitors and disposed to facilitate connection to a surface mounted integrated circuit device.

10. A method of making a monolithic multiple capacitor containing a plurality of capacitors with reduced parasitic capacitance between adjacent external connections in the monolithic multiple capacitor, the method comprising the steps of:
  a. disposing a plurality of layers of sintered ceramic material to form a bottom electrically insulating section;
  b. disposing a plurality of layers of ceramic material interior to the bottom electrically insulating section, each layer of ceramic material including a conducting layer disposed to form a first plate of a capacitor, the conducting layer brought to a discreet location at an edge of the first layer of ceramic material to make an external connection;
  c. disposing a further plurality of layers of ceramic material on the plurality of layers of ceramic material, each of the further plurality of layers including a further conducting layer, the further conducting layers of the further plurality of layers of ceramic material being disposed adjacent to the conducting layers of the plurality of layers of ceramic material to form a second plate of the capacitor, the second conducting layer brought to a further discreet location at an edge of the further layer of ceramic material to make an external connection at the further discreet location;
  d. repeating steps b. and c. a predetermined number of times to produce one or more further capacitors of a desired value;
  e. disposing a plurality of layers of sintered ceramic material to form a top electrically insulating section of the monolithic multiple capacitor;
  f. disposing first and second electrically conducting metallized layers respectively associated with the discreet and further discreet locations of each capacitor, the electrically conducting metallized layers being substantially perpendicular to each of the layers of sintered ceramic material and respectively interconnecting the discreet and further discreet locations; and
  g. forming a plurality of rectangular, saw cut slots substantially perpendicular to each of the layers of sintered ceramic material to remove portions of the electrically conducting metallized layer and sintered ceramic material, the rectangular, saw cut slots having a width and a depth, the depth of one or more of the rectangular, saw cut slots being greater than the width thereof thereby to reduce parasitic capacitance between adjacent electrical connections.

11. The method of making a monolithic multiple capacitor of claim 10 wherein the ceramic material has a dielectric coefficient of about 2600.

12. The method of making a monolithic multiple capacitor of claim 10 wherein the ceramic material has a dielectric coefficient of about 9000.

13. The method of making a monolithic multiple capacitor of claim 10 wherein the ceramic material is a composition based on barium titanate.

14. The method of making a monolithic multiple capacitor of claim 10 comprising in addition the step of disposing a plurality of layers of ceramic material having a dielectric constant of about 100 in the top insulating section and the bottom insulating section of the capacitor.

15. The method of making a monolithic multiple capacitor of claim 10 comprising in addition the step of disposing a plurality of ceramic material having a dielectric constant of about 100 between the capacitors.

16. The method of making a monolithic multiple capacitor of claim 15 comprising in addition the step of disposing a ground plane conductor between the capacitors.

17. The method of claim 16 comprising in addition the step of connecting the conductor to electrical ground.

18. A monolithic multiple capacitor comprising:
 a. a ceramic body having a length;
 b. a plurality of electrically conductive parallel layers disposed in said body and layered along said length, each conductive layer having an edge connection extending to an edge of said ceramic body;
 c. a plurality of metallized bus strips extending along the length of said ceramic body and selectively interconnecting said edge connections to form a plurality of capacitors, said bus strips and said edge connections forming a plurality of external connections; and
 d. a plurality of rectangular, saw cut slots disposed between adjacent metallized bus strips, said rectangular, saw cut slots having a depth and a width, the depth of at least one of the rectangular, saw cut slots being greater than the width thereof thereby to allow selective reduction of parasitic capacitance between adjacent external connections.

19. A monolithic multiple capacitor as claimed in claim 18 wherein said ceramic body has a top portion disposed above said plurality of electrically conductive layers, a mid-portion including said plurality of electrically conductive layers, and a bottom portion disposed below said plurality of electrically conductive layers, said top and bottom portions including a plurality of layers of ceramic material having a dielectric constant that is significantly lower than the dielectric constant of the ceramic material disposed in said mid portion of said ceramic body.

20. A monolithic multiple capacitor as claimed in claim 19 wherein said plurality of layers of ceramic material of said top and bottom portions include a ceramic material having a dielectric constant of about 100.

21. A monolithic multiple capacitor as claimed in claim 26 wherein the dielectric constant of the ceramic material forming the mid-portion of said ceramic body is approximately 2600.

22. A monolithic multiple capacitor as claimed in claim 20 wherein the dielectric constant of the ceramic material forming the mid-portion of said ceramic body is approximately 900.

23. A monolithic multiple capacitor as claimed in claim 19 wherein said plurality of electrically conductive layers form at least first and second capacitors, said first and second capacitors being capacitively isolated from one another by a region of ceramic material having a low dielectric constant.

24. A monolithic multiple capacitor as claimed in claim 23 wherein said region of ceramic material having a low dielectric constant is a ceramic material having a dielectric constant of approximately 100.

25. A monolithic multiple capacitor as claimed in claim 18 wherein said ceramic body includes a surface, said surface including tabs electrically connected to at least one of said plurality of capacitors and disposed to facilitate connection to a surface mounted integrated circuit device.

26. A monolithic multiple capacitor as claimed in claim 18 and further comprising a ground plane disposed between at least two of said plurality of capacitors to capacitively isolate said two of said plurality of capacitors from one another.

27. A method of making a monolithic multiple capacitor containing a plurality of capacitors with reduced parasitic capacitance between adjacent external connections in the monolithic multiple capacitor, the method comprising the steps of:
 a. providing a monolithic capacitor comprising ceramic body having a length,
  a plurality of electrically conductive parallel layers disposed in said body and layered along said length, each conductive layer having an edge connection extending to an edge of said ceramic body,
  a plurality of metallized bus strips extending along the length of said ceramic body and selectively interconnecting said edge connections to form a plurality of capacitors, said bus strips and said edge connections forming a plurality of external connections; and
 b. forming a plurality of rectangular, saw cut grooves between adjacent edge connections to selectively adjust capacitance between adjacent edge connections, at least two of said rectangular, saw cut grooves having different dimensions.

28. A method as claimed in claim 27 wherein said step of forming a plurality of rectangular, saw cut grooves between adjacent edge connections is further defined by forming a plurality of rectangular, saw cut grooves between adjacent edge connections to selectively adjust capacitance between adjacent edge connections, at least two of said rectangular, saw cut grooves having different depths.

29. A method as claimed in claim 28 wherein said step of forming a plurality of rectangular, saw cut grooves between adjacent edge connections is further defined by forming a plurality of rectangular, saw cut grooves between adjacent edge connections to selectively adjust capacitance between adjacent edge connections, at least two of said rectangular, saw cut grooves having different depths, at least one of said at least two rectangular, saw cut grooves having a depth greater than its width.

* * * * *